(12) United States Patent
Zimmermann

(10) Patent No.: US 7,508,315 B2
(45) Date of Patent: Mar. 24, 2009

(54) SIGNALING DEVICE AND METHOD OF ALERTING A WORK MACHINE OPERATOR TO A PREDETERMINED CONDITION USING SAME

(75) Inventor: Daniel E. Zimmermann, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 207 days.

(21) Appl. No.: 11/270,418

(22) Filed: Nov. 9, 2005

(65) Prior Publication Data

US 2007/0103327 A1    May 10, 2007

(51) Int. Cl.
   *G08B 21/00* (2006.01)
(52) U.S. Cl. ............. 340/663; 340/660; 320/164; 320/162; 361/33; 361/56; 361/92
(58) Field of Classification Search ........... 340/660, 340/663, 664; 320/162, 164; 361/21, 30, 361/33, 56, 90, 92, 20
See application file for complete search history.

(56) References Cited

U.S. PATENT DOCUMENTS

| 3,544,986 | A |   | 12/1970 | Earling et al. |           |
|-----------|---|---|---------|----------------|-----------|
| 3,702,469 | A |   | 11/1972 | Golja          |           |
| 3,811,122 | A | * | 5/1974  | Raber et al.   | 340/636.11|
| 4,155,082 | A | * | 5/1979  | Jones et al.   | 340/656   |
| 4,510,549 | A | * | 4/1985  | Tedesco        | 361/86    |
| 4,983,955 | A | * | 1/1991  | Ham et al.     | 340/664   |
| 5,406,254 | A |   | 4/1995  | Le Nay et al.  |           |
| 5,663,711 | A |   | 9/1997  | Sanders et al. |           |
| 5,793,184 | A |   | 8/1998  | O'Connor       |           |
| 5,896,091 | A |   | 4/1999  | Soderlund      |           |
| 6,169,389 | B1| * | 1/2001  | Chen           | 320/166   |
| 7,042,363 | B2| * | 5/2006  | Katrak et al.  | 340/644   |

FOREIGN PATENT DOCUMENTS

CH                  612023          6/1979

* cited by examiner

*Primary Examiner*—Daniel Wu
*Assistant Examiner*—Hongmin Fan
(74) *Attorney, Agent, or Firm*—Liell & McNeil

(57) ABSTRACT

A signaling device includes an electrical circuit which discharges an electrical energy storage device through an electrically powered alert mechanism via a biased open transition switch upon disruption of electrical power in an electrical system of a work machine. A work machine is further provided having an alert device coupled with a normally closed electrical power circuit, the alert device being activated upon opening of the normally closed electrical circuit via a transistor switch. An associated method includes using the signaling device to alert a work machine operator to a predetermined condition by closing a normally open electrically switch to connect an electrical energy storage device with an electrically powered alert mechanism, via an electronic controller or via interruption of electrical power in a normally closed electrical circuit of a work machine.

4 Claims, 2 Drawing Sheets

SIGNALING DEVICE AND METHOD OF ALERTING A WORK MACHINE OPERATOR TO A PREDETERMINED CONDITION USING SAME

TECHNICAL FIELD

The present disclosure relates generally to condition signaling devices, and more particularly to a signaling device that activates when its electrical circuit is removed from its power supply.

BACKGROUND

Signaling devices that involve alert mechanisms which emit audible and/or visual signals are used in a broad range of mechanical, hydraulic and electrically controlled devices and systems. A typical signaling device includes an alert mechanism that consists of a selectively activated speaker or other sound-generating device, such as a piezo-electric buzzer, coupled with an electrical power system. Common examples of audible alert mechanisms include any of the various beepers, buzzers, bells, or loudspeakers activated in a work machine when a particular operating condition is detected. For instance, in many work machines a bell is activated within earshot of an operator to alert him or her to a particular engine condition.

Virtually any aspect of a work machine can be monitored and have an associated audible or visual alert responsive to conditions such as engine temperature, oil pressure, fuel pressure and level, a hydraulic system condition, and even tire pressure. Increasingly, the various condition sensors known in the art have their outputs interpreted by an algorithm in an electronic control module (ECM). The ECM thus determines whether predetermined conditions have been met and directs a signaling device to activate an alert mechanism if necessary. Specifically, it would be useful to monitor a work machine's electro-hydraulic steering system and notify an operator when a primary system has encountered a malfunction and the machine is operating via a secondary redundant system. In this way an operator can get a machine serviced immediately.

A drawback of many known signaling devices is that the electrical circuit depends upon the machine's electrical power supply for the power necessary to activate the alert mechanism. This can be problematic if there is a mechanical fault or an undetected break in the electrical system. For instance, debris encountered by a work machine may unknowingly cut a wire that is part of the electrical circuit. In such a case, the operator might not be aware of a condition that could require his attention because the signaling device simply does not have the power required to activate an alert mechanism. Alarm failure may result in the need for costly repairs and significant time delays if, for example, a system fails before the operator realizes a problem exists because he is relying on an alarm requiring power from a faulty circuit.

U.S. Pat. No. 3,702,469 to Golja is directed to an alarm circuit operable to sound a bell when redundant power supplies fail. Golja utilizes switching transistors to detect increases and decreases in supply voltages that are greater than prescribed amounts, which are in turn indicative of a failure. While Golja sets forth a design having certain applications, particularly in systems requiring dual electrical power supplies, there is always room for improvement. For example, Golja would not be readily incorporated into existing work machines having a single primary electrical power source.

The present disclosure is directed to one or more of the problems set forth above.

SUMMARY OF THE DISCLOSURE

In one aspect, the present disclosure provides a signaling device, including a housing and a portion of an electrical circuit configured to connect with an electrical power supply and disposed at least partially within the housing. The portion of the electrical circuit includes an alert mechanism, an electrical energy storage device and an electrical switch operable to selectively connect the alert mechanism with the electrical energy storage device and having an open/closed state based at least in part on an electrical power supply voltage.

In another aspect, the present disclosure provides a work machine that includes an electrical system and a signaling device operably coupled with the electrical system. The signaling device includes an electrical energy storage device, an alert mechanism and a normally open electrical switch disposed between the electrical energy storage device and the alert mechanism. The electrical switch having an open/closed state based at least in part on an electrical system voltage.

In still another aspect, the present disclosure provides a method of alerting a work machine operator to the occurrence of a predetermined condition of a work machine. The method includes the step of supplying electrical power to a normally closed electrical circuit in an electrical system of the work machine, and the step of closing an electrical switch in a signaling device to electrically connect an electrically powered operator alert device with an electrical energy storage device, if a disruption in electrical power in the normally closed electrical circuit occurs.

DETAILED DESCRIPTION

Figure 1:
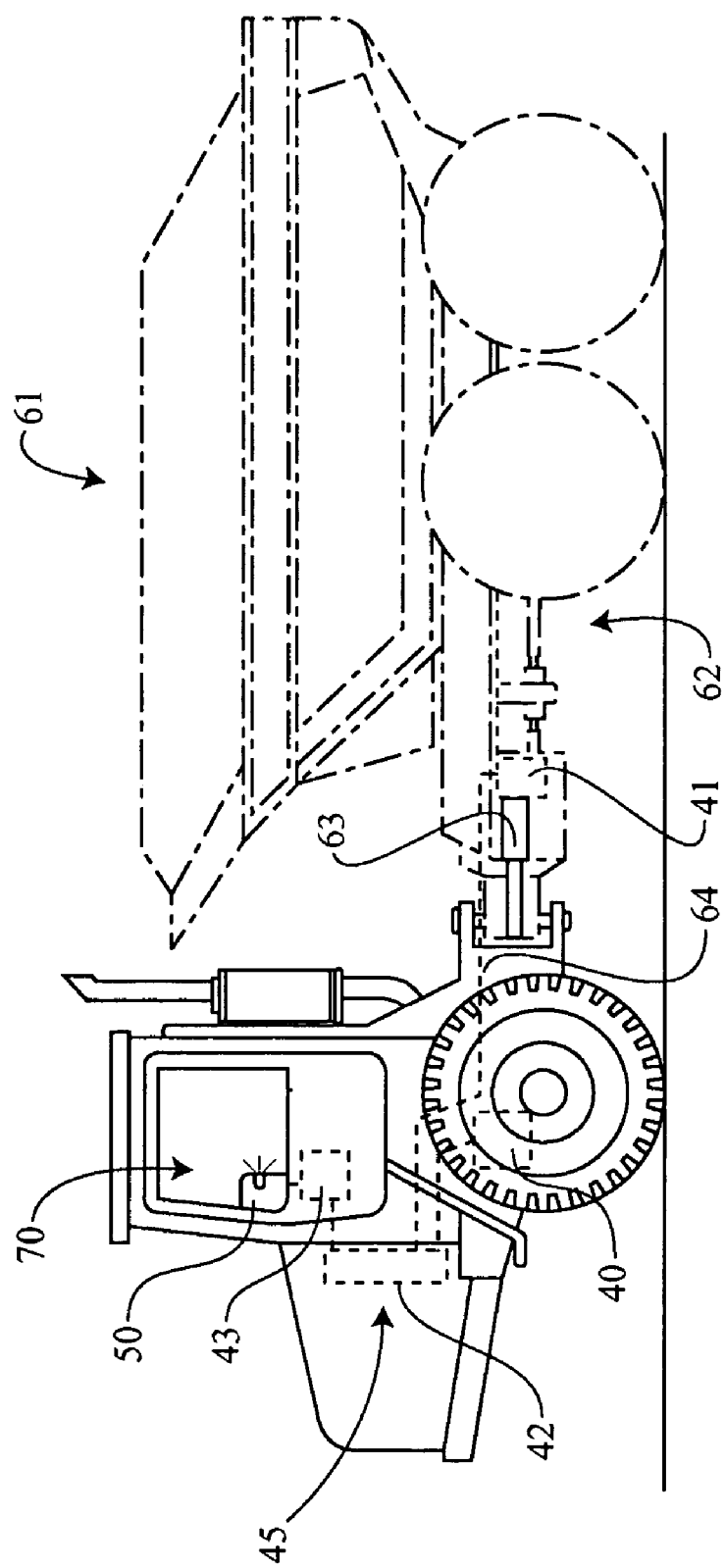
FIG. 1 is a diagrammatic side view of a work machine according to the present disclosure.

Referring to FIG. 1, there is shown a work machine 61 according to the present disclosure, which is illustrated as an articulated truck. It should be appreciated, however, that rather than a truck, work machine 61 may be another type of work machine such as a track-type tractor, loader or crane, or even a stationary device such as an industrial process system. Essentially any work machine where it is desirable to alert an operator to one or more operating conditions may benefit through the application of the teachings of the present disclosure. In the embodiment of FIG. 1, the work machine 61 includes a work machine body or chassis 62 and an electronic control module (ECM) 42. A movable member 63 such as a hydraulic cylinder is attached to the chassis 62 to facilitate steering. Movable member 63 may be part of an electro-hydraulic steering system 64, coupled with a predetermined condition monitor 41 operable to determine the occurrence of a predetermined condition of electro-hydraulic steering system 64 such as a system failure or power disruption and activate a signaling device 45 in the event of the same. Work machine 61 may include redundant steering systems such that failure of one system such as system 64 will not prevent steering of work machine 61 via another steering system (not shown). Another predetermined condition monitor 40 may be coupled with another work machine system such as an engine, transmission, hydraulic system, electrical system, etc.

Each of the predetermined condition monitors 40 and 41 may be coupled with signaling device 45, which is operable to alert an operator to the occurrence of a predetermined condition of the work machine 61 via an alert mechanism 50 mounted in an operator cabin 70. It should be appreciated that the alert mechanism 50 may be placed in any suitable location inside or outside operator cabin 70. It is contemplated that signaling device 45 will typically be activated upon inadvertent or commanded de-coupling of signaling device 45 from an electrical power supply system of work machine 61, as described herein.

Figure 2:
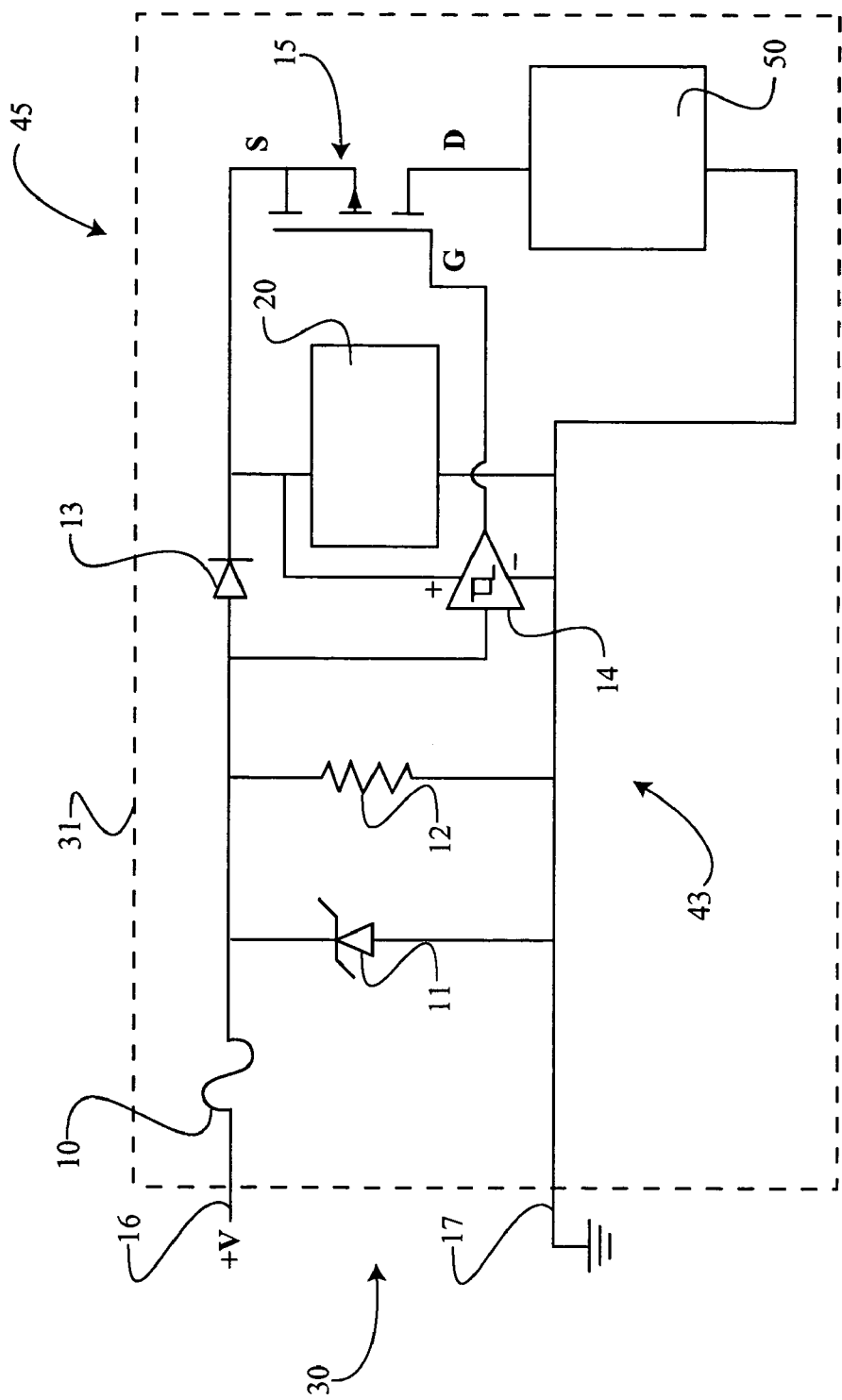
FIG. 2 is a schematic view of the signaling device including the electrical circuit and alert mechanism according to the present disclosure.

Referring to FIG. 2, there is illustrated a signaling device 45 suitable for use with work machine 61 of FIG. 1, wherein similar elements have similar numbers to FIG. 1. The signaling device 45 includes a portion of an electrical circuit 43 disposed at least partially within a housing 31. Electrical circuit portion 43 (hereafter electrical circuit 43) may include an electrical energy storage device 20, such as a capacitor or battery, connected to a DC electrical power supply 30, such as the electrical system of work machine 61. Power supply 30 may include a normally closed electrical power supply circuit, positive and negative terminals thereof being shown in FIG. 2, to provide power to any number of electrically powered/controlled devices of work machine 61 such as electro-hydraulic steering system 64. The electrical connection between power supply 30 and electrical circuit 43 may be by way of input/output lines of power supply 30 and via electrical connection leads 16 and 17 of electrical circuit 43 in a conventional plug and socket relationship accessible from outside housing 31. Leads 16 and 17 may connect with positive and negative terminals of the electrical power supply 30.

Electrical circuit 43 may further include an electrical switch 15 and an alert mechanism 50 such as a bell, buzzer, speaker, vibratory mechanism or light. Electrical switch 15 and alert mechanism 50 are typically arranged in series with each other. Electrical switch 50 may be a normally open, i.e. biased open, transistor switch such as a p-channel FET, a bipolar transistor or some other type of switch such as an electrically actuated mechanical switch coupled with a relay. A p-channel power MOSFET is contemplated to provide one practical implementation strategy.

Electrical energy storage device 20 may be connected to the source S of the electrical switch 15. The drain D of electrical switch 15 may be connected to alert mechanism 50, such that electrical power may be supplied from electrical energy storage device 20 to alert mechanism 50 when switch 15 is closed. Because switch 15 is normally open, no electrical current will flow between electrical energy storage device 20 and alert mechanism 50 unless switch 15 is closed, as described herein, by changing the voltage at a gate G. Those skilled in the art will appreciate that a bipolar junction transistor could function similarly, with voltage at its base used to control power flow across a collector and emitter in a conventional manner.

Electrical energy storage device 20 may also be disposed in parallel with a resistor 12 coupled with leads 16 and 17, which is selected to bias electrical switch 15 open, but not otherwise significantly affect operation of signaling device 45. In appropriate circumstances, resistor 12 might be omitted from the design. Further, a diode 13 in a forward orientation may be positioned between gate G of electrical switch 15 and electrical energy storage device 20 to prevent undesired switching on of switch 15.

Gate G of electrical switch 15 will typically be coupled with a Schmitt trigger 14 disposed between gate G and first electrical lead 16. Use of a Schmitt trigger or equivalent device will facilitate desired control of gate voltage and, hence, activation of alert mechanism 50 irrespective of minor voltage fluctuations in electrical circuit 43 which might otherwise cause switch 15 to turn on and off.

Electrical circuit 43 may also be coupled with a voltage surge protector consisting of a circuit breaker such as a "slo-blo" fuse 10, and a Zener diode 11 for protecting electrical energy storage device 20 from possible voltage spikes. A "slo-blo" fuse 10 may be particularly desirable in this application, as a sustained voltage fluctuation is required to blow the fuse rather than brief voltage increases such as may result from activating the air-conditioner of the work machine 61, for example, but do not call for alerting the operator. It should be recognized, however, that the "slo-blow" fuse 10 could be replaced by any device such as another type of circuit breaker or any other variety of fuse that will open the electrical circuit 43 in the event of a voltage spike. In any event, however, when fuse 10 blows, the connection between circuit 43 and electrical power supply 30 will be broken, and alert mechanism 50 will be activated, as described herein. In some embodiments, fuse 10 might be omitted from the design.

While signaling device 45 is shown disposed wholly within housing 31, those skilled in the art will appreciate that one or more housings might be used. For instance, a retrofit part consisting of some or all of the components of signaling device 45 might be coupled with an existing work machine electrical system, serving as an add-on or a replacement for an older model. Further still, the unique circuitry of signaling device 45 will allow the device to be incorporated into an existing work machine electrical system which previously had no signaling device at all. In this manner, an existing work machine may be equipped with a signaling device operable to alert an operator to a power system disruption or failure where previously the operator could receive no such indication. In some embodiments, this could be done simply by coupling signaling device 45 with an electrical power or communication line of the work machine.

The present disclosure further contemplates a method of alerting a work machine operator to the occurrence of a predetermined condition of a work machine. As used herein, the term "predetermined condition" may be a state of essentially any component or system of work machine whose condition it is desirable to communicate to an operator. For instance, a power failure or disruption in electrical power supply system 30 of work machine 61 could be communicated to an operator via signaling device 45. Similarly, a communication failure between one of predetermined condition monitors 40 and 41 and ECM 42 might activate signaling device 45 as described herein.

The method may include the step of supplying electrical power to a normally closed electrical circuit in an electrical system of a work machine. The normally closed electrical circuit may be a circuit that supplies power to a work machine component, such as electro-hydraulic steering system 64, for example. The method may further include the step of closing an electrical switch in a signaling device, such as switch 15 in device 45 to electrically connect an electrically powered operator alert device with an electrical energy storage device, if a disruption in electrical power in the normally closed electrical circuit occurs. Thus, a failure or sufficient voltage or current change in electrical power supply 30 can cause switch 15 to close, thereby connecting alert mechanism 50 with electrical energy storage device 20. While it is contemplated that one means by which switch 15 may be closed is via an inadvertent decoupling of electrical circuit 43 from electrical power supply 30, such as where a power supply line is cut, the present disclosure also contemplates commanding decoupling of electrical circuit 43 from power supply 30 with ECM 42 for signaling or diagnostic purposes. Thus, an actual power failure or disruption need not occur, and signaling device 45 may be used to alert an operator to the occurrence of such predetermined conditions as oil pressure, fuel level, or even the approaching of work machine 61 to an obstruction.

INDUSTRIAL APPLICABILITY

As described, in one specific example, the present disclosure contemplates the use of signaling device 45 in work machines such as articulated work machine 61 and similar work machines which are controlled by multiple, redundant steering systems. In such an embodiment, it may be desirable for an operator to be alerted when a primary steering system fails so that the machine may be serviced quickly while steering is maintained through a redundant system. In other words, where redundant steering systems are used, the operator may be unaware that one steering system has failed since operation may be continued via another steering system.

Alternatively, rather than electrical power supply interruption serving as the predetermined condition, a communication failure or control signal failure between one or more sensors and ECM 42 could trigger activation of signaling device 45. Thus, the "normally closed" electrical circuit of interest need not be a power supply circuit at all. For example, a communication line between ECM 42 and a hydraulic pressure, temperature or even engine speed sensor is contemplated as a normally closed electrical circuit within the context of the present disclosure. Where signaling device 45 is coupled with such a communication line, a break therein could induce closing of switch 15 and activation of alert mechanism 50.

In yet other applications, it is contemplated that signaling device 45 may be activated via ECM 42 in situations other than inadvertent power or communication failure. In particular, as described, ECM 42 may be in communication with predetermined condition monitors 40 and 41. When ECM 42 detects a predetermined condition, for example, via a signal from one of monitors 40 and 41, ECM may command opening of power supply circuit 30 such that closing of switch 15 occurs and alert device 50 is activated. Another switch for this purpose might be disposed within power supply circuit 30 or between power supply circuit 30 and electrical circuit 43. To this end, ECM may include a detection algorithm, for example recorded on a computer readable medium such as ROM, RAM or another suitable medium, the detection algorithm including means for opening power supply circuit 30 to activate alert mechanism 50.

In a related vein, ECM may include a startup diagnostic algorithm, whereby ECM 42 selectively de-couples electrical power supply 30 from electrical circuit 43. The electrical circuit 43 with its respective alert mechanism 50 would consequently activate and alert an operator. In such an embodiment, electrical power may subsequently be restored so the alert ceases, and the electrical energy storage device 20 can resume charging via power supply 30. By this method, the machine operator would know that signaling device 45 is working properly, if the alert mechanism 50 failed to sound then the operator would be notified that there was a problem in electrical circuit 43. Such a problem might involve a fault in the ECM 42, a loose socket connection from the electrical leads 16, 17, or a broken wire in electrical circuit 43 itself.

It should be further recognized that there could be a multitude of predetermined condition monitors that are coupled with ECM 42 and processed via a detection algorithm. If multiple conditions are satisfied, then signaling device 45 would be activated. By way of illustration only, a predetermined condition sensor 40 could monitor whether a door was open, and a second predetermined condition sensor 41 could monitor whether the work machine 61 was in gear. If both conditions are satisfied, then ECM 42 could activate signaling device 45 via the means described herein.

During typical operation of work machine 61, ECM 41 will initiate a startup diagnostic algorithm upon initialization as described herein, for instance, when the work machine ignition is activated. Substantially simultaneously, electrical power via power supply circuit 30 will begin charging electrical energy storage device 20, at least where a capacitor is used. Electrical power via power supply 30 in conjunction with resistor 12 will bias gate G open via a positive polarity voltage such that no power flows to alert mechanism 50, as well as providing a similar positive polarity voltage to source S. After the electrical energy storage device 20 has been sufficiently charged, the electrical circuit 43 ceases to draw substantial current from the electrical power supply 30.

Activation of signaling device 45 will typically occur when electrical power supply 30 is de-coupled from electrical circuit 43 for any reason. De-coupling of power supply 30 from electrical circuit 43 will cause electrical switch 15 to become enhanced because the voltage of the gate G will drop, causing electrical switch 15 to close. This allows the electrical energy storage device 20 to discharge through the electrical switch 15 and the alert mechanism 50, generating an audible signal or light, for example. It will be understood that the length of time that the alert mechanism 50 is activated depends upon a number of factors known to one normally skilled in the art, two of which are the capacity of the electrical energy storage device 20 and the power draw of the alert mechanism 50. It is contemplated that these factors can be tailored to the specific needs of the work machine 61, and are appropriately encompassed by the spirit and scope of this disclosure.

Schmitt trigger 14 serves to limit the occurrence of false alarms by preventing switch 15 from closing in the event of slight and temporary voltage drops experienced during typical operation. It should be recognized that there are numerous devices and means that can be used for this purpose, and Schmitt trigger 14 is merely exemplary, and in no way definitive. Neither is a false alarm avoidance device such as a Schmitt trigger 14 definitive of, nor necessary to, electrical circuit 43 fulfilling its function of activating alert mechanism 50 in the event of de-coupling from electrical power supply 30.

Zener diode 11 and fuse 10 serve to keep the voltage of electrical circuit 43 below a predetermined threshold in the event of voltage spikes. Zener diode 11 may be chosen to have a 16 V opening threshold in the case of a 12 volt electrical power supply, for example. Fuse 10 may be chosen to open during prolonged voltage surges above the Zener diode threshold. One skilled in the art will recognize that this disclosure contemplates not only Zener diode 11 and fuse 10 as described, but also any suitable means of regulating the voltage and protecting the other components of electrical circuit 43. Although alert mechanism 50 is discussed as generating an audible noise, the present disclosure also contemplates any suitable alert mechanism, including but not limited to visual devices (e.g. lights), vibratory mechanisms, or any other type of alert that could be useful in alerting an operator.

Those skilled in the art will recognize that because signaling device 45 is controlled by ECM 42, it could be activated for a number of reasons. During typical operation, ECM 42 will detect a condition, and sound alert mechanism 50 by removing electrical power to its respective electrical circuit 43. Alternatively, the electrical circuit 43 may activate the alert mechanism 50 in the event of a problem involving a circuit upstream of the electrical circuit 43 that results in electrical power supply 30 being de-coupled, such as accidental cutting of a wire by a piece of debris. It is contemplated that another reason the circuit would be opened is a mechanical fault of electrical circuit 43 such as the "slo-blo" fuse 10 being opened by a voltage surge, or debris damaging the electrical circuit 43 during normal operation.

It should be understood that the present description is intended for illustrative purposes only, and is not intended to limit the scope of the present disclosure in any way. Thus, those skilled in the art will appreciate that various modifications might be made to the presently disclosed embodiments without departing from the spirit and scope of the present disclosure. Other aspects, features and advantages will be apparent from a study of the attached drawings and appended claims.

What is claimed is:

1. A machine comprising:
   a chassis;
   at least one steering system connected to the chassis;
   an electrical system connected to the chassis;
   a signaling device operably coupled with said electrical system and including an electrical energy storage device, an alert mechanism and a normally open electrical switch disposed between said electrical energy storage device and said alert mechanism, said electrical switch having an open/closed state based at least in part on an electrical system voltage;
   said electrical system comprises a power supply including first and second input/output lines coupled with said signaling device;
   said electrical switch comprising a biased open transistor switch having a gate/base coupled with one of said input/output lines and being configured to close upon de-coupling from said power supply;
   said electrical energy storage device comprises at least one of a battery and a capacitor;
   said electrical switch comprises a p-channel FET disposed between said electrical energy storage device and said alert mechanism; and
   at least one pre-determined condition monitor and an electronic controller in communication therewith, said electronic controller being configured to selectively de-couple said signaling device from said power supply based on a control signal or a control signal failure between said electronic controller and said at least one pre-determined condition monitor.

2. A machine comprising:
   a chassis;
   at least one steering system connected to the chassis;
   an electrical system connected to the chassis;
   a signaling device operably coupled with said electrical system and including an electrical energy storage device, an alert mechanism and a normally open electrical switch disposed between said electrical energy storage device and said alert mechanism, said electrical switch having an open/closed state based at least in part on an electrical system voltage;
   said electrical system comprises a power supply including first and second input/output lines coupled with said signaling device;
   said electrical switch comprising a biased open transistor switch having a gate/base coupled with one of said input/output lines and being configured to close upon de-coupling from said power supply;
   said electrical energy storage device comprises at least one of a battery and a capacitor;
   said electrical switch comprises a p-channel FET disposed between said electrical energy storage device and said alert mechanism; and
   an electronic controller that includes a startup diagnostic algorithm to temporarily de-couple the power supply from the signaling device during initialization.

3. A machine comprising:
   a chassis;
   at least one steering system connected to the chassis;
   an electrical system connected to the chassis;
   a signaling device operably coupled with said electrical system and including an electrical energy storage device, an alert mechanism and a normally open electrical switch disposed between said electrical energy storage device and said alert mechanism, said electrical switch having an open/closed state based at least in part on an electrical system voltage said electrical system comprises a normally closed electrical circuit having first and second input/output lines including a positive terminal and a negative terminal;
   said electrical switch is a normally open transistor switch having a gate/base coupled with said positive terminal and maintained at a normally positive voltage thereby; and
   an electronically controlled redundant machine steering system coupled with said normally closed electrical circuit, wherein said transistor switch is configured to close upon opening of said normally closed electrical circuit.

4. A method of alerting a machine operator to the occurrence of a predetermined condition of a machine comprising the steps of:
   steering the machine responsive to an operator riding on the machine;
   supplying electrical power to a normally closed electrical circuit in an electrical system of the machine;
   closing an electrical switch in a signaling device to electrically connect an electrically powered operator alert device with an electrical energy storage device, if a disruption in electrical power in the normally closed electrical circuit occurs;
   the electrical switch is a transistor switch, the step of closing an electrical switch comprising a step of adjusting a voltage at a gate/base of the transistor switch, if the normally closed electrical circuit is opened;
   monitoring at least one machine operating parameter at least in part via an electronic controller; and
   opening the normally closed electrical circuit of the signaling device via a control signal from the electronic controller, if the at least one machine operating parameter other than a power failure meets a predetermined criterion.

* * * * *